US009128155B2

(12) United States Patent
Xing

(10) Patent No.: US 9,128,155 B2
(45) Date of Patent: Sep. 8, 2015

(54) SWITCH DETECTION SYSTEM

(75) Inventor: Gang Xing, Shanghai (CN)

(73) Assignee: OTIS ELEVATOR COMPANY, Farmington, CT (US)

( * ) Notice: Subject to any disclaimer, the term of this patent is extended or adjusted under 35 U.S.C. 154(b) by 233 days.

(21) Appl. No.: 13/700,232

(22) PCT Filed: Jun. 2, 2010

(86) PCT No.: PCT/US2010/036994
§ 371 (c)(1),
(2), (4) Date: Dec. 20, 2012

(87) PCT Pub. No.: WO2011/152823
PCT Pub. Date: Dec. 8, 2011

(65) Prior Publication Data
US 2013/0106422 A1    May 2, 2013

(51) Int. Cl.
*G01R 31/00* (2006.01)
*G01R 31/327* (2006.01)
*B66B 5/00* (2006.01)
*B66B 13/22* (2006.01)

(52) U.S. Cl.
CPC ............ *G01R 31/327* (2013.01); *B66B 5/0087* (2013.01); *B66B 13/22* (2013.01)

(58) Field of Classification Search
CPC .................................................... G01R 31/327
USPC ................................................. 324/415, 713
See application file for complete search history.

(56) References Cited

U.S. PATENT DOCUMENTS

| 1,702,515 | A | | 2/1929 | Lindquist | |
|---|---|---|---|---|---|
| 3,464,012 | A | * | 8/1969 | Camp et al. | 324/115 |
| 3,585,584 | A | | 6/1971 | Behrend | |
| 3,718,856 | A | * | 2/1973 | Hendriks | 324/658 |
| 3,760,265 | A | | 9/1973 | Hutch | |

(Continued)

FOREIGN PATENT DOCUMENTS

| JP | 6255831 | 4/1987 |
|---|---|---|
| JP | 62501990 | 8/1987 |

(Continued)

OTHER PUBLICATIONS

International Preliminary Report on Patentability and Written Opinion of the International Searching Authority for International Application No. PCT/US2010/036994; International Filing Date: Jun. 2, 2010; 4 pages.

(Continued)

*Primary Examiner* — Jeff Natalini
(74) *Attorney, Agent, or Firm* — Cantor Colburn LLP

(57) ABSTRACT

A switch detection system (100) includes a first switch (102) having a pole node (153), a normally closed contact (160), and a normally open contact (161), the pole node (153) of the first switch (102) connected to a voltage source node (104), a second switch (102) having a pole node (153), a normally closed contact (160) and a normally open contact (161), the pole node (153) of the second switch (102) connected to the normally closed contact (160) of the first switch (102), a voltage detector (106) connected to the normally closed contact (160) of the second switch (102), a first resistor (108) connected to the normally open contact (161) of the first switch (102), and a second resistor (108) connected to the normally open contact (161) of the first switch (102) and the normally open contact (161) of the second switch (102).

12 Claims, 1 Drawing Sheet

(56) References Cited

U.S. PATENT DOCUMENTS

| | | | |
|---|---|---|---|
| 3,828,340 A | | 8/1974 | Bauer, Jr. et al. |
| 3,858,193 A | | 12/1974 | Bach |
| 3,938,121 A | | 2/1976 | Jamison |
| 4,125,833 A | | 11/1978 | Ravey |
| 4,670,663 A | * | 6/1987 | Fancher ............... 307/113 |
| 5,105,181 A | * | 4/1992 | Ross ..................... 340/657 |
| 5,509,505 A | | 4/1996 | Steger et al. |
| 5,714,852 A | | 2/1998 | Enderich |
| 5,818,707 A | * | 10/1998 | Seong et al. ............ 363/89 |
| 6,193,019 B1 | | 2/2001 | Sirigu et al. |
| 6,446,760 B1 | | 9/2002 | Lisi |
| 6,467,585 B1 | | 10/2002 | Gozzo et al. |
| 7,503,435 B2 | | 3/2009 | Tyni et al. |
| 2007/0090902 A1 | * | 4/2007 | Deligianni et al. ....... 335/78 |
| 2007/0247133 A1 | * | 10/2007 | Isobe et al. ............. 323/312 |
| 2008/0084213 A1 | * | 4/2008 | Waite et al. ............. 324/424 |

FOREIGN PATENT DOCUMENTS

| | | |
|---|---|---|
| JP | 01258322 A | 10/1989 |
| JP | 11343075 | 12/1999 |
| JP | 2009023829 A | 2/2009 |
| KR | 1990054777 | 7/1999 |
| KR | 19990084698 | 12/1999 |
| WO | 8605277 A1 | 9/1986 |
| WO | 2011152823 A1 | 12/2011 |

OTHER PUBLICATIONS

Bernstein, Plastic-bodied Limit Switches, Biggy, [online]; [retrieved on Jun. 2, 2010]; retrieved from the Internet http://www.automation-dfw.com/pdf/3-25-09/Bernstein/04%20BERNSTEIN%20BIGGY%20LIMIT%20SWITCHESbi_gb.pdf.

English Abstract for KR 1019990054777A, "Floor Recognition Apparatus for an Elevator, Especially for Substituting a Dip Switch and a Gate Array With a Matrix Circuit Composed of Low Cost Ristors and Capacitors", http://kpa.kipris.or.kr/XML/199700074649A0/kpa.xml; 1 pg., Jul. 15, 1999.

English Abstract for KR1019990084698A, "Digital to Analog Converter, Especially for Minimizing a Size of the Digital to Analog Converter in an Analog to Digital Converter of a Successive Approximation Register", http://kpa.kipris.or.kr/XML/1899800016638A0/kpa.xml; 1 pg., Dec. 6, 1999.

English Abstract for JP11343075(A) "Parking Operation Device of Elevator", http://v3.espacenet.com/publicationDetails/biblio?DB=EPODOC&adjacent=true&locale-e . . . , downloaded Mar. 30, 2011, 1 page.

International Search Report for International Application No. PCT/US2010/036994; International Filing Date: Jun. 2, 2010; 3 pgs.

* cited by examiner

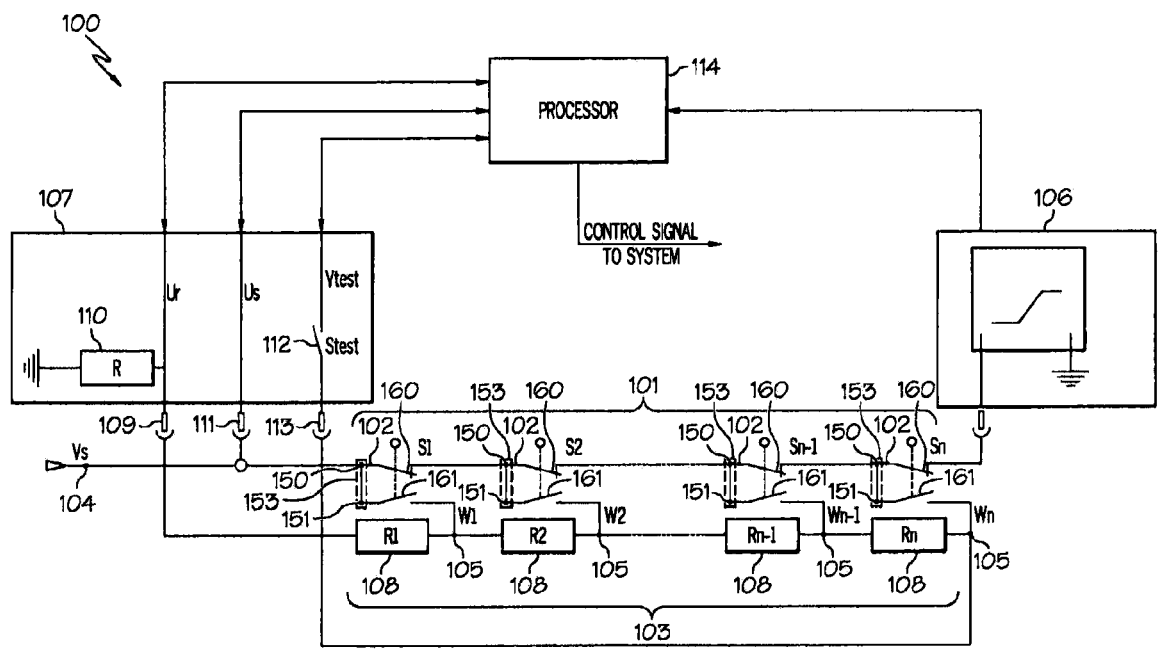

SWITCH DETECTION SYSTEM

CROSS-REFERENCE TO RELATED APPLICATIONS

This application is a U.S. national phase application filed pursuant to 35 U.S.C. 371 and claims benefit of PCT Patent Application No. PCT/US2010/036994; filed Jun. 2, 2010 and assigned International Publication No. WO2011/152823A1, published Dec. 8, 2011.

BACKGROUND OF THE INVENTION

The subject matter disclosed herein relates to control systems, particularly switch detection systems for elevator and escalator control systems.

Switch detection systems may include a plurality of switches electrically connected to a control system. A switch detection system may be used to determine whether a switch in the system has been actuated and identify which particular switch has been actuated.

The determination and identification of an actuated switch may be used to control a system such as, for example, an elevator or escalator system.

BRIEF DESCRIPTION OF THE INVENTION

According to one aspect of the invention, a switch detection system includes a first switch having a pole node, a normally closed contact, and a normally open contact, the pole node of the first switch connected to a voltage source node, a second switch having a pole node, a normally closed contact and a normally open contact, the pole node of the second switch connected to the normally closed contact of the first switch, a voltage detector connected to the normally closed contact of the second switch, a first resistor connected to the normally open contact of the first switch, a second resistor connected to the normally open contact of the first switch and the normally open contact of the second switch, and a processor having a first connection connected to the pole node of the first switch and a second connection connected the first resistor.

According to another aspect of the invention, a method for determining an actuated switch in a system includes receiving an indication from a voltage detector that the voltage detector is not detecting a voltage, measuring a voltage in a circuit, the circuit including at least one switch and at least one resistor connected in series, determining the resistance of the circuit, dividing the resistance of the circuit with the known resistance of the at least one resistor to determine a number of resistors in series in the circuit, associating the number of resistors in series in the circuit with a number of corresponding switches in the circuit, identifying an actuated switch in the system responsive to associating the number of resistors in series in the circuit with the number of corresponding switches in the circuit, outputting a signal indicating the identified actuated switch.

According to yet another aspect of the invention, a switch detection system includes a first switch having a pole node, a normally closed contact, and a normally open contact, the pole node of the first switch connected to a voltage source node, a second switch having a pole node, a normally closed contact and a normally open contact, the pole node of the second switch connected to the normally closed contact of the first switch, a first resistor connected to the normally open contact of the first switch, and a second resistor connected to the normally open contact of the first switch and the normally open contact of the second switch.

These and other advantages and features will become more apparent from the following description taken in conjunction with the drawings.

BRIEF DESCRIPTION OF THE DRAWING

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

FIG. 1 illustrates an exemplary embodiment of a switch detection system.

The detailed description explains embodiments of the invention, together with advantages and features, by way of example with reference to the drawings.

DETAILED DESCRIPTION OF THE INVENTION

FIG. 1 illustrates an exemplary embodiment of a switch detection system 100. The system 100 includes switches (S1-Sn) 102 in a switch array 101 that may include any number (n) of switches 102. In the illustrated embodiment, each switch 102 includes a first pole 150 and a second pole 151 connected to form a single pole node 153, a normally closed contact 160, and a normally open contact 161. The contacts are arranged such that when the normally closed contact 160 is opened, the normally open contact 161 is closed. The pole nodes 153 of the switches 102 and normally closed contacts 161 of the switches are connected in series between a voltage source (Vs) node 104 and a voltage detector 106. Similar (or substantially identical) resistors (R1-Rn) 108 are arranged in series in a resistor array 103. Each of the resistors 108 is paired with a corresponding switch 102 such that the system 100 includes n number of switches and resistors. The array 103 includes nodes (W1-Wn) 105 arranged between the resistors 105 (the node Wn is arranged at the end of the series of resistors 108); each node 105 connects each resistor 108 to the normally open contact 161 of the paired switch 102. A switch identifier circuit 107 includes a node 109 that is connected to the R1 resistor 108, a node 111 that is connected to the voltage source node 104, and may include a node 113 that is connected to the Wn node 105. The 109 terminal is connected to a resistor 110 that is connected to ground. The terminal 113 may be connected to a voltage source (Vtest) via a test switch (Stest) 112. A processor 114 may be communicatively connected to the switch identifier circuit 107 and the voltage detector 106.

In operation, when each of the normally closed contacts 160 of the switches 102 are in the closed position, the voltage detector 106 detects the voltage from the voltage source node 104. The voltage detector 106 may send a signal to the processor 114 indicating that a voltage is detected from the voltage source node 104. When a switch 102 for example, switch S2 102, is actuated, the normally closed contact 160 of the switch S2 102 is opened, and the normally open contact 161 of the switch S2 102 is closed. The electrical connection between the voltage source node 104 and the voltage detector 106 is disconnected, and the voltage detector 106 will not detect a voltage. The voltage detector 106 may send a signal to the processor 114 that indicates that no voltage is detected. The closing of the normally open contact 161 of the switch S2 102 results in a current path that flows from the voltage source node 104 through the (closed) normally closed contact 160 of switch S1 102, the (closed) normally open contact 161 of switch S2 102, the resistor R2 108, the resistor R1 108, and the node 109 to the processor 114. The processor 114 senses the voltage source (Vs) at the voltage source node 104 (at the node 111) and the resistance voltage (Vr) at the node 109. Since the resistors 108 have similar resistance, Vr=Vs/n+1. Solving for n, n=Vs/Vr−1, where n is the number of resistors 108 connected in series when a switch 102 is actuated (the normally open contact 161 is closed and the normally closed contact 160 is open). Since each switch 102 is paired with a resistor 108, the actuated switch may be identified.

In the above example, the actuation of the switch S2 102 results in a loss of voltage to the voltage detector 106. The voltage detector 106 sends a signal to the processor 114. The processor 114 detects the voltages Vs and Vr and solves the above equation for n. The resultant n=2 indicates that there are two resistors (R1 and R2) connected in series. Since each resistor 108 is pared with a switch 102, n=2 indicates that the switch S2 102 has been actuated. The indication of a particular actuated switch 102 may be used by the processor 114 to control associated systems, such as for example, an elevator or escalator system. For example, the processor 114 may output a control signal to control visual, audio, or other non-textual indicators in the system, or may output a control signal to control mechanical elements of the system such as, elevator cars.

The Stest switch 112 may be used to test the system. If the normally closed contacts of the switches 102 are closed, the Stest switch 112 may be closed and voltage may be applied across the resistor array 103. If the system 100 is operating properly, the total resistance of the resistor array 103 (Rt), where Rt=ΣRn should be detected. The processor 114 may compare the Rt to a threshold resistance value. If Rt is less than the threshold, the processor may indicate a failure in the system, by for example, outputting a failure message to an operator, lighting a failure indicator light (not shown), or performing control logic associated with the failure.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A switch detection system comprising:
 a first switch having a pole node, a normally closed contact, and a normally open contact, the pole node of the first switch connected to a voltage source node;
 a second switch having a pole node, a normally closed contact and a normally open contact, the pole node of the second switch connected to the normally closed contact of the first switch;
 a voltage detector connected to the normally closed contact of the second switch;
 a first resistor connected to the normally open contact of the first switch;
 a second resistor connected to the normally open contact of the first switch and the normally open contact of the second switch; and
 a processor having a first connection connected to the pole node of the first switch and a second connection connected to the first resistor;
 wherein the processor is configured to:
  determine a voltage across the first connection of the processor and the second connection of the processor;
  determine a voltage drop across the connections of the processor; and
  calculate a number of resistors in series between the first connection of the processor and the second connection of the processor.

2. The system of claim 1, wherein the system further includes a third switch connected to the processor and to the normally open contact of the second switch.

3. The system of claim 2, wherein the processor is configured to:
 close the third switch;
 apply a voltage across the first resistor and the second resistor;
 measure the total resistance of the first resistor and the second resistor;
 compare the measured resistance of the first resistor and the second resistor with a threshold resistance; and
 indicate a failure responsive to determining that the measured resistance is less than the threshold resistance.

4. The system of claim 1, wherein the voltage detector is configured to detect a voltage and send an indication that a voltage is detected to the processor.

5. The system of claim 1, wherein the first resistor and the second resistor have the same resistance.

6. A switch detection system comprising:
 a first switch having a pole node, a normally closed contact, and a normally open contact, the pole node of the first switch connected to a voltage source node;
 a second switch having a pole node, a normally closed contact and a normally open contact, the pole node of the second switch connected to the normally closed contact of the first switch;
 a first resistor connected to the normally open contact of the first switch;
 a second resistor connected to the normally open contact of the first switch and the normally open contact of the second switch, the first resistor and second resistor connected in series; and
 a processor having a first connection connected to the pole node of the first switch and a second connection connected to the first resistor;
 wherein the processor is configured to:
  determine a voltage across the first connection of the processor and the second connection of the processor;
  determine a voltage drop across the connections of the processor; and
  calculate a number of resistors in series between the first connection of the processor and the second connection of the processor.

7. The switch detection system of claim 6, wherein the system further comprises a voltage detector connected to the normally closed contact of the second switch.

8. The system of claim 7, wherein the voltage detector is configured to detect a voltage and send an indication that a voltage is detected to the processor.

9. The system of claim 6, wherein the system further includes a third switch connected to the processor and to the normally open contact of the second switch.

10. The system of claim 9, wherein the processor is configured to:
 close the third switch;

apply a voltage across the first resistor and the second resistor;

measure the total resistance of the first resistor and the second resistor;

compare the measured resistance of the first resistor and the second resistor with a threshold resistance; and indicate a failure responsive to determining that the measured resistance is less than the threshold resistance.

11. The system of claim 6, wherein the first resistor and the second resistor have the same resistance.

12. The system of claim 6, wherein the processor is configured to receive a signal from a voltage detector, the signal indicative that the voltage detector is not detecting a voltage prior to determining a voltage across the first connection of the processor and the second connection of the processor.

* * * * *